United States Patent [19]

Hidaka et al.

[11] Patent Number: 5,023,703
[45] Date of Patent: Jun. 11, 1991

[54] SEMICONDUCTOR DEVICE

[75] Inventors: Norio Hidaka; Shigeyuki Yamamura, both of Sagamihara; Masumi Fukuta, Machida, all of Japan

[73] Assignee: Fujitsu Limited, Kawasaki, Japan

[21] Appl. No.: 448,858

[22] Filed: Dec. 12, 1989

Related U.S. Application Data

[63] Continuation of Ser. No. 571,542, filed as PCT JP83/00129 on Apr. 26, 1983, published as WO83/03922 on Nov. 10, 1983, Pat. No. 4,908,694.

[30] Foreign Application Priority Data

Apr. 30, 1982 [JP] Japan ................. 57-7308

[51] Int. Cl.[5] .................. H01L 23/02; H01L 23/12
[52] U.S. Cl. .......................... 357/74; 357/80
[58] Field of Search ..................... 357/74, 80

[56] References Cited

U.S. PATENT DOCUMENTS

| | | | |
|---|---|---|---|
| 4,186,994 | 2/1980 | Denkin et al. | 350/96.20 |
| 4,266,090 | 5/1981 | Scherer | 357/74 |
| 4,267,565 | 5/1981 | Puppolo et al. | 357/74 |
| 4,412,093 | 10/1983 | Wildeboer | 357/74 |
| 4,455,448 | 6/1984 | Bertolina | 174/35 R |
| 4,461,924 | 7/1984 | Butt | 357/74 |
| 4,698,661 | 10/1987 | Bessonneau et al. | 357/74 |

FOREIGN PATENT DOCUMENTS

| | | |
|---|---|---|
| 51-116980 | 8/1952 | Japan . |
| 61-12680 | 3/1954 | Japan . |
| 54-43971 | 3/1979 | Japan . |

*Primary Examiner*—William L. Sikes
*Assistant Examiner*—Robert E. Wise
*Attorney, Agent, or Firm*—Staas & Halsey

[57] ABSTRACT

A semiconductor device comprising a metal base providing a metal case and a through-passage connecting the inside and outside of said metal case, an electric terminal which provides a bridge selectively deposited on the insulator base allowing formation of conductive layer thereon, said insulator base and said conductive layer and is integrated with said insulator base and is insertingly engaged with the through-passage of said metal base, and a semiconductor element accommodated in said metal case, wherein a pseudo-coaxial line structure is composed of said conductive layer, insulator base, insulator bridge and metal case. Accordingly a device of the present invention is capable of stably operating even at a frequency of 10 GHz or higher.

16 Claims, 10 Drawing Sheets

FIG. 13
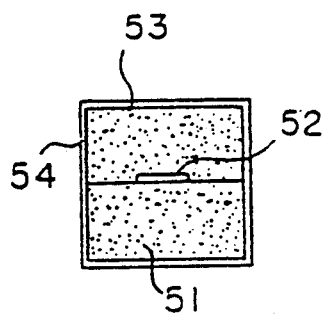
FIG. 16
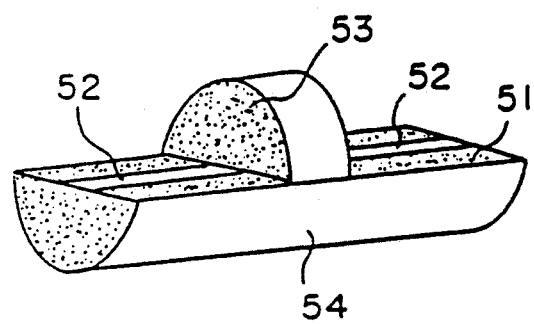
FIG. 14
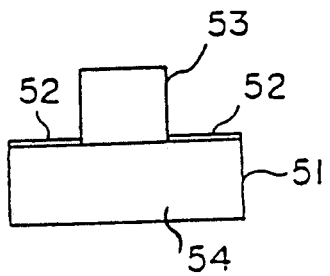
FIG. 17(a)
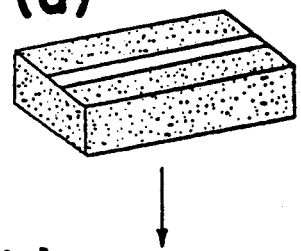
FIG. 15
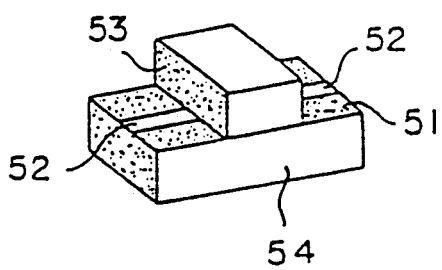
FIG. 17(b)
FIG. 17(c)
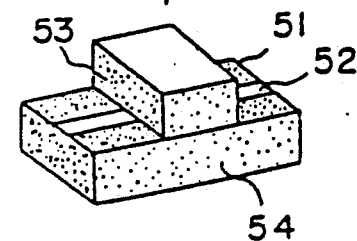

SEMICONDUCTOR DEVICE

CROSS REFERENCES TO RELATED PATENTS

This is a continuation of U.S. Ser. No. 571,542, filed as PCT JP83/00129 on Apr. 26, 1983, published as WO83/03922 on Nov. 10, 1988 now U.S. Pat. No. 4,908,694.

BACKGROUND OF THE INVENTION

This invention relates to a semiconductor device and specifically to a semiconductor device having a package structure which has been improved so that it can be applied to an ultra-high frequency circuit or high speed digital circuit.

Along with the rapid progress in improvements in data processing system operation speed and capacity, efforts have been made continuously toward development of a semiconductor device to be applied to data processing which realizes operation at a higher frequency and higher electrical power.

For example, as an active semiconductor device, a semiconductor element consisting of a compound semiconductor such as gallium-arsenide (GaAs), for example, a gallium-arsenide Schottky barrier type field effect transistor, have been applied in place of existing semiconductor elements consisting of silicon (Si). Such gallium-arsenide Schottky barrier type field effect transistors have been further improved so that they can now operate at a higher frequency and provide a higher electrical power.

On the other hand, packages for accommodating such a semiconductor device operating at a higher frequency and electrical power, having the structure shown in FIG. 1 through FIG. 12, have been proposed.

FIG. 1 is a perspective view of the main part of a ceramic frame type package, wherein 1 is a copper (Cu) base; 2 is a ceramic case; 2A is a first ceramic frame; 2B is a second ceramic frame; 3 is a lead segment; and 4 is a metallized film for sealing, respectively.

FIG. 2 is a perspective view of the main part of a ceramic plate type package, wherein 5 is a copper base; 6 is a ceramic plate; 6A is a window for accommodating a semiconductor element; and 7 is a conductive film, respectively.

These packages are now widely used because they are small in size and cheap to use as a package for a semiconductor element or small-size solid state apparatus. An attempt to obtain a higher performance package has encountered various problems.

For example, in the case of the structure shown in FIG. 1, when an element is hermetically sealed by securing a ceramic cover using a metallized film 4, the ring-shaped metallized film 4 on the ceramic frame 2B may resonate. Such resonance occurs at a frequency determined in accordance with a circumference of the ring-shaped metallized film 4. When a metal cover or a ceramic cover which is metallized is used for sealing, the resonance frequency can be raised a little but resonance occurs in accordance with the area of metallized part. Therefore, this type of package is restricted to relatively low frequency use and is generally not used in the ultra-high frequency situations for this reason.

Moreover, the package with a structure as shown in FIG. 2 is also not suitable for ultra-high frequency or speed because crosstalk may occur between the conductive films 7, however this package is designed for a high speed digital circuit. Recently, the requirement for high speed digital circuits also has urged development of circuits particularly for high speed operation, and accordingly circuits operating in the GHz band are now appearing in the Si based systems as well as in the GaAs based system elements. These circuits, for example, logic circuits and memory circuits, have complicated functions and have input/output terminals requiring as many as 10 to 40 pins. Improvement in high speed operation of these logic and memory circuits is accompanied by other problems in addition to the sealing problem and crosstalk mentioned above, for example, signal leakage due to a combination of signals between terminals due to existence of many terminals within a restricted area, resonance and oscillation. In addition, high speed operation is degraded by an increase of the parasitic capacitance at the sealing area.

Circuits for use in an ultra-high frequency band are currently formed on a carrier manufactured by laminating copper and a ceramic, the carriers are placed within a metal case type package as shown in FIG. 3 or FIG. 4, and the entire assembly is sealed to protect the circuits from ambient environmental conditions. FIG. 3 is a perspective view of a metal case type package, whereby 8 is a metal case; 9 is a coaxial connector; 9A is a core conductor; and 10 is an insulator consisting of ceramic or resin, respectively. FIG. 4 is a perspective view of a metal case type package with brims, wherein 11 is a metal case with brims; 12 is an insulator; and 13 is a core conductor, respectively. These packages provide disadvantages in that they occupy more space in actual practice than their size indicates and such disadvantages as well as others are explained in detail below.

In FIG. 3, the coaxial line is provided at the sealing part, connection with external circuit is carried out through the coaxial connector 9 and connection with internal circuits is carried out through the extended core conductor 9A. Therefore, as shown in FIG. 5, a chip including a strip line 9B of 50Ω is formed on the ceramic plate 10A, the core conductor 9A and strip line 9B are connected and the strip line 9B and pad of the internal circuits (the chip) are lead-bonded resulting in a connection of the internal circuits which have the strip line structure. This structure provides a merit in that the coaxial connector 9 can be easily coupled to the coaxial connector of an external circuit but also provides many demerits when trying to realize a small size, high reliability and low cost which are all currently required for a semiconductor device and particularly provides the following two very serious problems.

(i) It is difficult to realize a substantial size reduction because a coaxial connector is used. In attempting to solve such a problem, the core conductor 13 is connected to the strip line of an external circuit. This structure certainly provides a merit in that the coaxial connector can also be used as required but it is difficult to guarantee the characteristic of the external coaxial/strip line conversion since the external conversion to the strip line is performed by users, and it is also difficult to realize impedance matched conversion circuits for a wider operating frequency band.

(ii) Hermetic sealing is difficult because the time required for sealing is longer. Generally, in brazing sealing, a brazing material is placed on the area to be sealed, the cover is then placed thereon, the pieces are held together with a required force and then they are put into a thermostatic oven. The brazing material melts when it reaches the melting point and penetrates into the sealing area and metal of the cover, thus resulting in hermetic sealing. However, in this case, a large amount of gas within the package, for example, nitrogen, is heated and expands, applying pressure to the brazing material from the inside. This causes pin-holes in the sealing area. Moreover, when the package is hermetically sealed by welding, it is difficult to keep constant welding conditions and the welding must be done individually, requiring a long time. Accordingly, yield deteriorates, and manufacturing costs rise. Welding will become particularly more difficult as packages become smaller.

On the other hand, the inventors of this invention have attempted a modification, for example, as shown in FIG. 6, to the package of FIG. 1. In FIG. 6, the same portions as those in FIG. 1 are given the same reference symbols. The metallized films 14, 15, 16 and 17 are formed (coated) on the inside and outside of the ceramic case 2 and both sides of lead segments 3, and moreover these are in contact with the metallized film 4 on top of the ceramic case 2. The effective length of the ring consisting of metallized film 4 is curtailed because of its indirect contact with base 1. However, such a package cannot be used in a high frequency range even with such a modification because of the influence produced by parasitic capacitance and parasitic inductance of the added metallized films.

In addition, the same inventors have also manufactured an ultra-miniature package as shown in FIG. 7. In FIG. 7, the portions that are the same as those in FIG. 1 are given the same reference symbols. This prior art FIG. 7 is different from that of FIG. 1 in that it provides high frequency input terminal, high frequency output terminal 19 and DC input terminals 20, 21, 22 and 23. Moreover, a balanced type amplifier formed as an ultra-miniature circuit on a sapphire substrate is contained within the package, although it is not shown. This device has a merit in that it is small in size and is hermetically sealed, and since the RF input and output terminals of the circuit on the sapphire substrate are matched to the characteristic impedance by using hybrid couplers formed on the sapphire substrate, it is also possible to directly connect a plurality of amplifier stages hermetically sealed by housing the circuits in a package as shown in FIG. 8 and, lead-bonding the terminals on the ceramic frame 2A within the package to the external connecting terminals of the circuits on the sapphire substrate.

In FIG. 8, the three semiconductor devices sealed in the package shown in FIG. 7 are directly connected and the portions that are the same as those in FIG. 7 are given the same reference symbols. In FIG. 8, when high frequency input power is applied to the terminal 18 and DC voltages to the terminals 20, 22, respectively, these are then further supplied to the second and third stages and thereby a high frequency output can be obtained from the terminal 19. This device provides good performance in the 4–8 GHz the range. When using this amplifier in 3–18 GHz range the ring shaped metallized film provided for hermetical sealing resonates in spite of the treatment performed as in the case of the package shown in FIG. 6. The resonant frequency is about 11 GHz which is within the range of 3–18 GHz and an 8–18 GHz amplifier can not be realized. The earth or ground electrode of this package presents another problem as will be discussed later.

Currently, an internal matching type GaAs field effect semiconductor device as shown in FIG. 9 has been manufactured. In FIG. 9, the portions which are the same as those in FIG. 1 are given the same reference symbols. This device provides within the package, the semiconductor chip 24, input matching circuit 25 and output matching circuit 26. The impedance matching is performed within the package for users for whom it is difficult to form the circuit using a semiconductor chip 24 which is a GaAs-FET, and thereby users are only required to prepare and provide a simple external matching circuit, to obtain the desired characteristic, and a DC bias circuit. Accordingly, the device as shown in FIG. 9 is widely used because the desired characteristics can be easily obtained.

However, this package has a disadvantage in that satisfactory performance cannot be obtained when frequency becomes high because the impedance of the GaAs-FET becomes low and moreover parasitic capacitance, parasitic inductance and high frequency loss in the package increase. In addition, because of the resonance of the ring-shaped metallized film as explained above, and the problem related to the earth electrode to be explained later, currently usable packages are limited to the frequency of about 10 GHz. Therefore, a package which can be used for a frequency band exceeding 10 GHz wherein the above-mentioned situation becomes more serious has long been desired. Some packages, however, are currently used in the frequency range of 10 GHz or higher. Such a very small-size package is used for a frequency up to 12 GHz but it is restricted in its application because of its small size and is used only for a low noise GaAs-FET.

Now, the problem of the earth or ground electrode which is in common to any ceramic frame type package will be explained. In general, a package used in a high frequency band has been associated with a problem of cracks generated in the ceramic part due to a difference in thermal expansion coefficients between the ceramic and metal portions. A package shown in FIG. 10 has been proposed in order to prevent such cracks. In FIG. 10, the portions which are the same as those in FIG. 1 are given the same reference symbols. As understood from the figure, the ring 5A is formed on the base 1 and the ceramic-frame 2A is mounted thereon. 27 is the metallized film.

This structure provides excellent crack prevention. However, if the frequency becomes higher than 10 GHz, the inductance of ring 5A which exists between the metallized film 27, which is the earth electrode of the ceramic frame 2A and the base 1, becomes larger. Therefore, the metallized film 27 which works as the earth electrode loses its function as the earth electrode and the impedance of the strip line deviates from the optimum value, deteriorating performance.

When a package as shown in FIG. 10 is coupled as indicated in FIG. 11, there is a disadvantage in that a cavity is formed in the area indicated by the arrow and a resonance at the frequency of about 8 GHz occurs. These devices can be cascaded by connecting the packages to each other and bonding at 28 the lead segments 3 as shown in FIG. 11.

As a structure of an electric terminal of a ceramic frame type package, the structure shown in FIG. 12 was proposed by the inventors. In FIG. 12, the portions which are the same as those in FIG. 1 are given the same reference symbols. In FIG. 12, annular metal materials 29, for example which are made of metallizing materials, are disposed on the ceramic case 2 arranged on the base 1 in such a way as surrounding the ceramic portion through which the lead segments 3 are extended from the walls of said ceramic case 2, and said annular metal materials 29 are connected electrically to the base 1. Such a device exhibits better characteristics for the frequency band of 4–8 GHz, since the electric terminal portion provides a pseudo coaxial cable with the annular metal material 29 used as the earth conductor. However, for example, in the 8–18 GHz band, the desired performance cannot be obtained because of parasitic capacitance between the annular metal material 29 and metallized film 4 for sealing. In addition, the annular metal material 29 is not perfectly grounded at a high frequency, for example, as high as 10 GHz or more and produces an inductance. In the extreme case, the annular metal material functions as an antenna.

As will be obvious from the above explanation, the production of packages which can be used for a frequency of 10 GHz or higher is desired for ultra-high frequency circuits and high speed digital circuits. This situation is becoming more serious day by day because recent packages employ the structure of strip line (connection with external circuit)—strip line (sealing part) strip line (connection with internal circuit).

SUMMARY OF THE INVENTION

It is an object of the present invention to provide a semiconductor device having a package structure suitable for ultra-high frequency or high speed digital circuits.

It is another object of the present invention to provide a package structure which does not generate any cracks resulting from the difference in thermal expansion coefficients of the insulators of an electric terminal portion.

It is still another object of the present invention to provide a package structure which does not allow generation of resonance or parasitic capacitance, etc. at the securing portion of a cover used for hermetic sealing.

According to the present invention, a semiconductor device includes a metal base which includes a metal case and a through-passage which connects both the inside and outside of the metal case, an insulator base allowing formation of a conductive layer on the surface thereof, electric terminals which provide insulator bridges arranged selectively on the insulator base and a conductive layer, and are secured insertably into the through-passage of metal base, and a semiconductor element is housed within said metal case.

BRIEF DESCRIPTION OF DRAWINGS

FIG. 1 through FIG. 4, FIG. 6 through FIG. 8, and FIG. 12 are perspective views of the main portion, FIG. 5 and FIG. 9 are plan views of the main portion and FIG. 10 and FIG. 12 are cross-sectional views of the main portion.

FIG. 13 through FIG. 15 are a plan view, a side view and a perspective view of the structure of an electric terminal of the present invention.

FIG. 16 is a perspective view indicating another embodiment of the electric terminal and FIG. 17, including a–c, are perspective views indicating the manufacturing process of the electric terminal.

FIG. 22(a) is a plan view, while

FIG. 25(a) is the plan view, while

FIG. 28(a) is a plan view while FIG. 28(b) is a front view of the main portion of another embodiment of the present invention.

DESCRIPTION OF THE PREFERRED EMBODIMENTS

Figure 1:
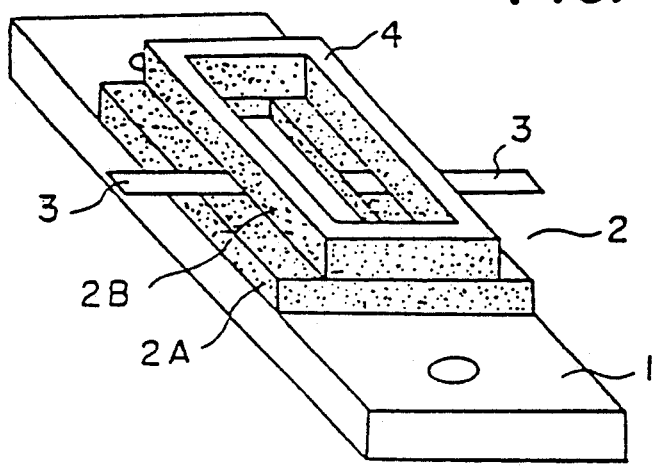
FIG. 1 through FIG. 12 are structures of existing semiconductor devices where

The semiconductor device of this invention is described by way of the first embodiment thereof with reference to the drawings. FIG. 13, FIG. 14 and FIG. 15 are respectively a front view, side view and perspective view of the electric terminal used in a semiconductor device according to the present invention. In these figures, 51 is an insulator base, for example, consisting of a ceramic plate; 52 is a strip line consisting of a conductive layer formed on the surface of base 51; 53 is an insulator bridge, for example, consisting of a ceramic plate; and 54 is a metallized film, respectively. The bridge 53 has the same Width as the base 51 and is shorter than the base 51 in the direction perpendicular to the inner and outer surfaces, namely in the same direction as the strip line 52. Therefore, the strip line 52 is partly exposed (See FIG. 15).

FIG. 16 is another embodiment of the electric terminal and the same portions as those of FIG. 15 are given the same reference symbols. This embodiment is different from the first embodiment explained before only in that the base 51 and bridge 53 are respectively semi-circular and they form a circle in combination when they are observed from the front end.

FIG. 17 is an example of the method of manufacturing the electric terminal in the present invention. As shown in FIG. 17(a), for example, a metal pattern (corresponding to the strip line 52) as part of a laminate consisting of tungsten is formed on an alumina raw ceramic plate (corresponding to the base 51, which is an unbaked ceramic substrate, generally called a green sheet). Then as shown in 17(b), for example, a small size alumina raw ceramic plate (corresponding to the bridge 53) is placed thereon and the entire unit is baked. Thereafter as shown in 17(c), the metallized film is formed at the bottom surface, side surface and upper surface of a small size ceramic plate, thus completing an element. After brazing the assembly onto a metal base, gold (Au) is plated. The electric terminal of the present invention is not always required to be square or circular as shown in FIG. 15 or FIG. 16 when viewed from the front end and but may be polygonal.

In this electrical terminal, the edge of strip line 52 is connected to the external circuit, while the other edge to the internal circuits, with separation by the bridge 53, respectively. Connection is carried out, for example, by lead bonding and electrical characteristics are obtained similar to those of a coaxial line. The laminate part of strip line 52, namely the area defined by the base 51 and bridge 53 is generally ribbon-shaped and the external conductor (main body of the metal package) act together in the high frequency band through the insulator usually square-shaped (also formed with a circular cross section) and therefore these cannot strictly be defined as coaxial, but can be considered as a pseudo-coaxial line from the view point of the electrical field because the external conductor which acts as the earth electrode and extends up the side thereof.

The size of the structure strip line—pseudo coaxial line—strip line can be freely designed. In the example of FIG. 13, a package forms, when observed from the front side, a square with a side of 1.2 mm, a length of bridge 53 (FIG. 14) in the same direction as the strip line of 0.5 mm, a length of the insulator base 51 supporting the bridge 53 in the same direction as the strip line of 1 mm, a length of strip line 52 of 0.25 mm, a width of the same of 0.3 mm, a laminate length of 0.5 mm and a width of the same of 0.25 mm.

Figure 18:
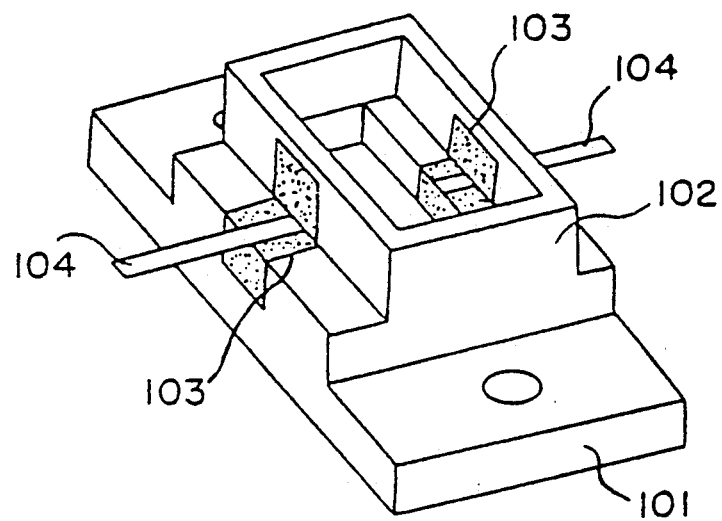
FIG. 18 is a perspective view of an embodiment of a semiconductor device of the present invention.

FIG. 18 is a perspective view of the main portion of an embodiment of the present invention. In the figure, 101 is a metal base consisting of copper (Cu), 102 is a case thereof, 103 is an electric terminal engaged insertingly with the through hole provided at the wall part of the case 103, and 104 is lead segment connectingly secured to the strip line 52 of the electric terminal 103. Although not shown in the figure, a semiconductor element and matching circuit etc., accommodated within the case 102, are hermetically sealed by the metal of a ceramic cover disposed covering the window of the case 102. The surface of the ceramic cover is metallized as required.

Figure 10:
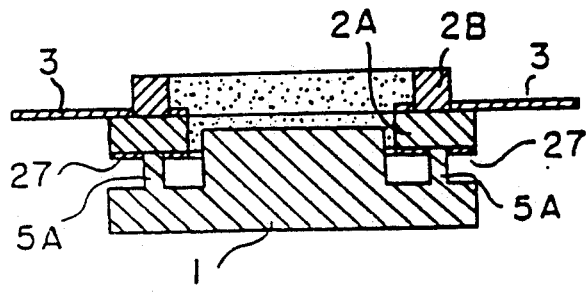
Figure 11:
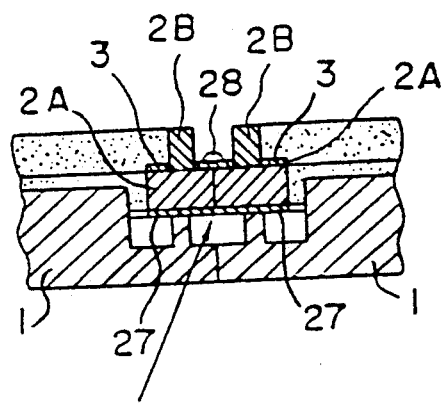
Figure 12:
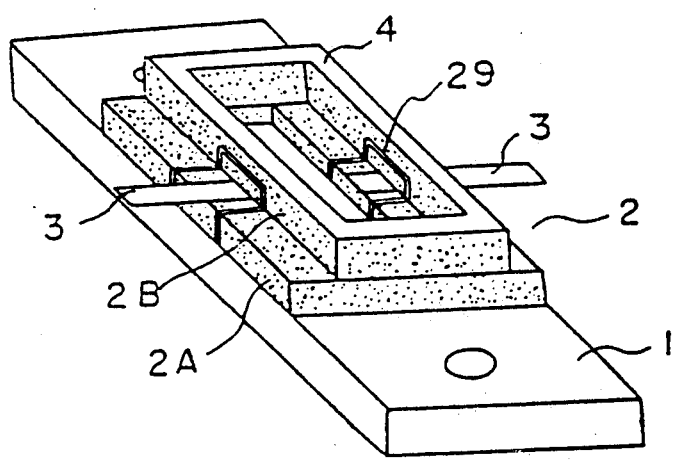
Figure 19:
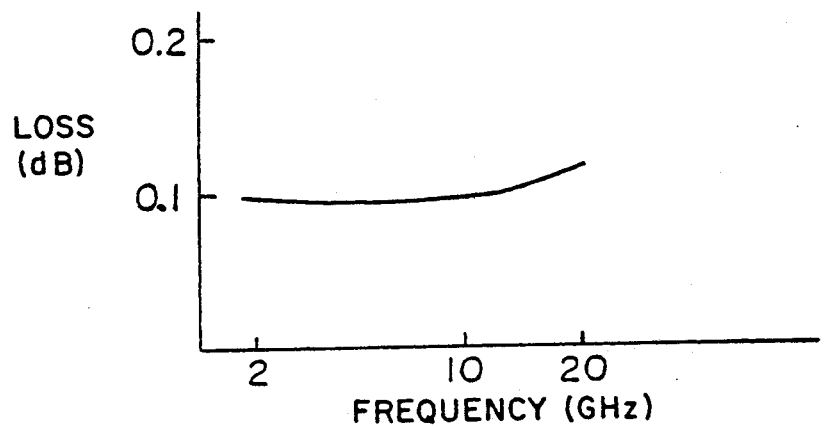
FIG. 19 and FIG. 20 are graphs indicating characteristics of the embodiment shown in FIG. 18.
Figure 20:
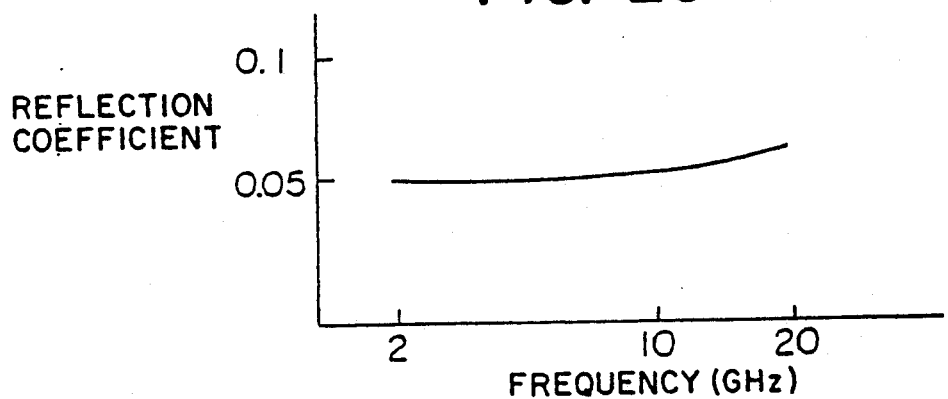

The characteristics of the input/output terminals of this embodiment (FIG. 18) are shown in FIGS. 19 and 20. In FIG. 19, high frequency loss is plotted on the vertical axis versus frequency on the horizontal axis. In FIG. 20, a power reflection coefficient at the terminal is plotted on the vertical axis versus frequency on the horizontal axis. Judging from these characteristic curves, this device can be used for an ultra-high frequency of at least 18 GHz and it can be expected that it can be also used in a further higher frequency band. Such excellent characteristics are ensured by the fact that the ring-shaped metallized film does not generate any resonance and the ring-shaped part 5A shown in FIG. 10 is not employed. This will then be explained with reference to FIG. 21.

Figure 21:
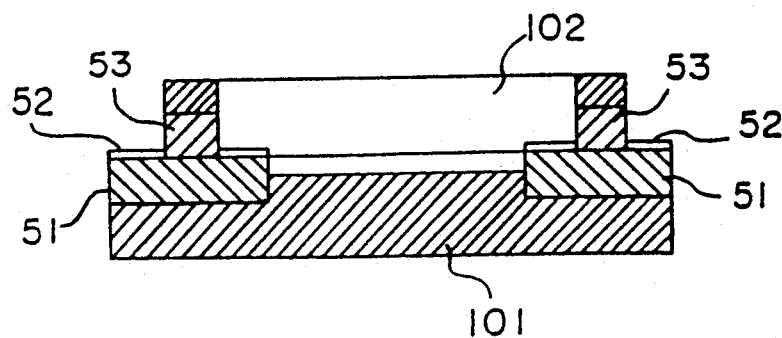
FIG. 21 is a sectional view of the main portion of the embodiment shown in FIG. 18.

FIG. 21 is a cross-sectional view in the vicinity of the electrode terminal in FIG. 18. The portions which are the same as those in FIG. 15 and FIG. 18 are also the same reference symbols. As is apparent from the figure, this embodiment provides a structure in which the insulator base 51 and bridge 53 are directly in contact with the earth electrode, namely in contact With the metal base 101 or case 102. Accordingly, it is assured that the part corresponding to external conductor of the strip lines and the pseudo-coaxial line (in the vicinity of laminate of the strip line) are reliably earthed or grounded, and there is no discontinuous impedance because the connecting part to the external circuits is formed as the strip line, the strip line and pseudo-coaxial line are designed optimumly and the upper surface of metal case 102 forms the metal layer for hermetic sealing.

Figure 22A:
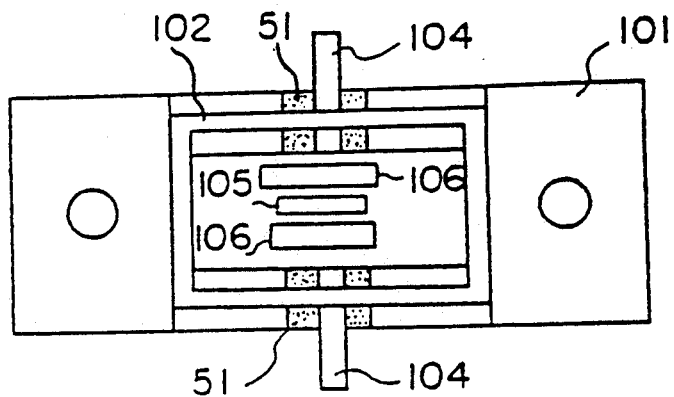
Figure 22B:
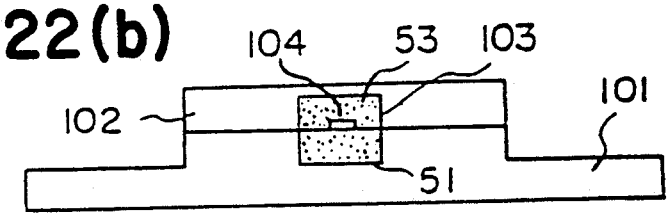
FIG. 22(b) is a front view of another embodiment of the present invention.

FIG. 22 is an embodiment of an internally matched GaAs-FET, where 22(a) is a plan view of the main part, while 22(b) is a front view of the same. The portions which are the same as those in FIG. 18 and FIG. 21 are given the same reference symbols. In this embodiment, the GaAs-FET chip 105 is placed on the metal base 101 and in the center of the inside of the case 102, and the insulator substrate 106 holding a simple matching circuit is provided on both sides of said GaAs-FET chip 105, and these elements and internal strip lines are connected by the lead bonding (not shown). The device has been used only in the frequency band below 10 GHz because of restriction from the viewpoint of package. But according to this embodiment, the package can be used in the entire frequency band of 20 GHz or lower, and moreover it can also be used up to the frequency band from 30 to 40 GHz by optimization of the structure.

Figure 23:
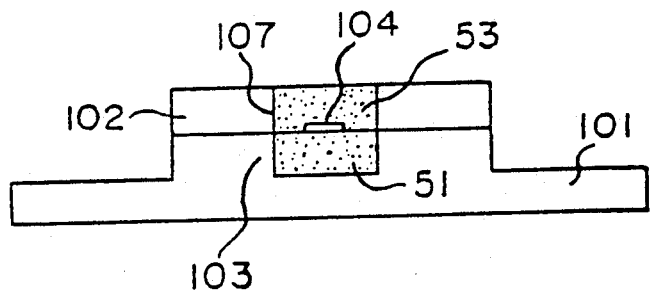
FIG. 23 and FIG. 24 are front views of another embodiment of the present invention.

FIG. 23 is a front view of the main portion of another embodiment. The portions which are the same as those in FIG. 22 are also given the same reference symbols. This embodiment is different from that of FIG. 22 in that the metal base 101 and case 102 with a cut-away part 107, are formed with an electrical terminal 103 engaged insertingly with the cut-away part by inserting an electrical terminal 103 comprising the base 51 and bridge 53, the upper surface of bridge 53 and the upper surface of case 102 are set in the same plane, and a ceramic cover (not shown) having the metallized film or metal cover is sealed thereon.

Figure 24:
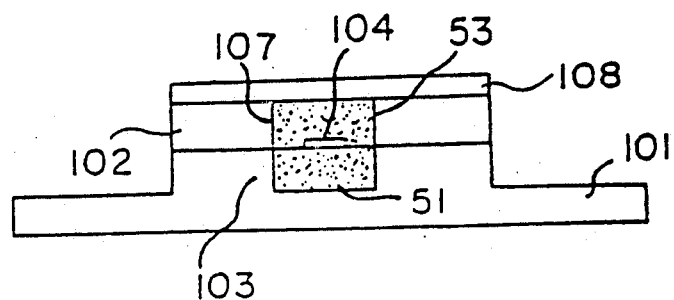

FIG. 24 is a front view of the main part of another embodiment and the portions which are the same as those of FIG. 23 are also given the same reference symbols. This embodiment is different from that of FIG. 23 in that an electric terminal 103 is engaged with the cut-away part 107 by inserting it therein, and a metal frame 108 is secured thereon. Thereby, the upper surface of bridge 53 is firmly earthed.

Figure 25A:
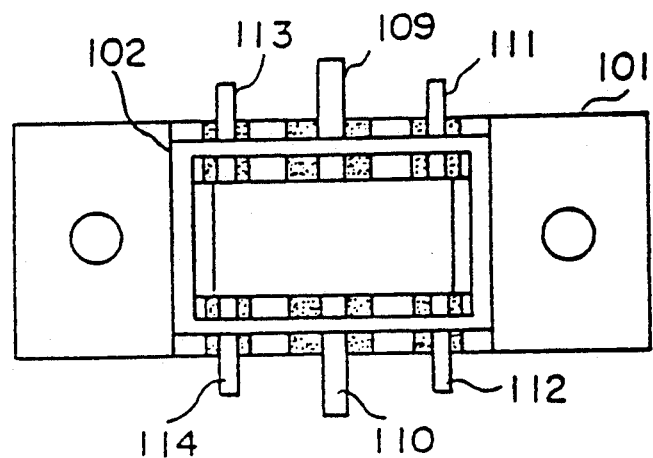
Figure 25B:
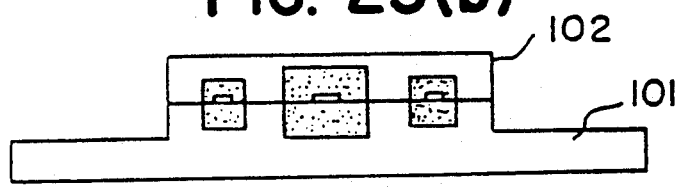
FIG. 25(b) is the front view of another embodiment of the present invention.

FIG. 25 is another embodiment where 25(a) is a plan view of the main part and 25(b) is a front view of the same. The portions which are the same as those in FIG. 22 are also given the same reference symbols. In this embodiment, an ultra-miniature balanced amplifier (not shown) is placed on the sapphire substrate and is then sealed into the case 102. Accordingly, this package is provided with lead segment 109 which is used as the high frequency input terminal, lead segment 110 also used as an output terminal, lead segments 111 and 112 used as the gate voltage output terminals, and the lead segments 113 and 114 used as the drain voltage terminals. If the gate voltage terminal and drain voltage terminal are used as the DC input terminals, the other gate voltage terminal and drain voltage terminal are used as the output terminals for supplying DC voltages to the next stage. When a plurality of cases according to this embodiment are connected, it is recommended that at least the lead segments other than the first and the last ones be removed and that the strip lines be mutually connected by the lead-bonding method.

Devices of the prior art which allow existence of high frequency coupling between the high frequency input-/output terminals and DC terminals cause influence on signal output such as a dip produced by resonance. However, this embodiment does not allow existence of such high frequency coupling because an electric terminal is isolated from the DC terminal by the earth electrode (metal base) since it is formed as a pseudo-coaxial line and the strip line is also isolated from DC terminal by the earth electrode.

Figure 26:
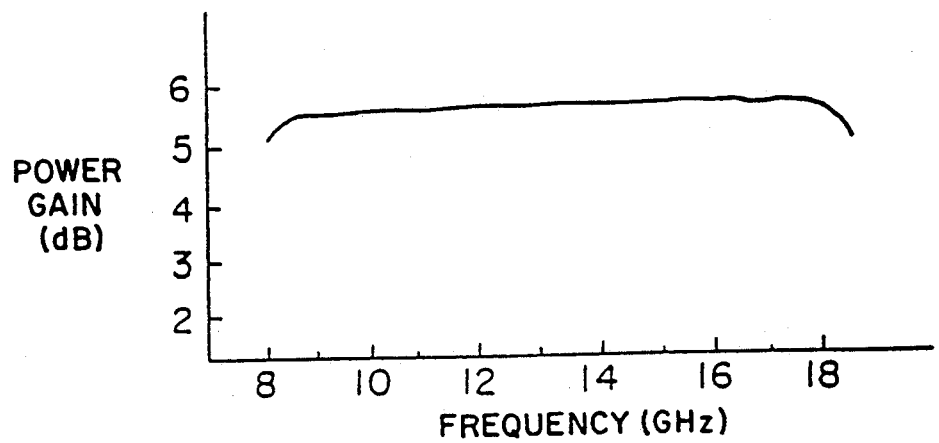
FIG. 26 and FIG. 27 are graphs of characteristics of the embodiment shown in FIG. 25.

FIG. 26 is a graph indicating the relationship between gain and frequency of the device which was explained with respect to FIG. 25, and designed and manufactured so that it can be operated in the frequency range from 8 to 18 GHz. Gain is plotted on the vertical axis versus frequency on the horizontal axis. A flat characteristic of from 5 to 6 dB can be obtained in the frequency range from 8 to 18 GHz and this excellent high frequency characteristic has never been obtained for a device sealed within a miniature package.

Figure 27:
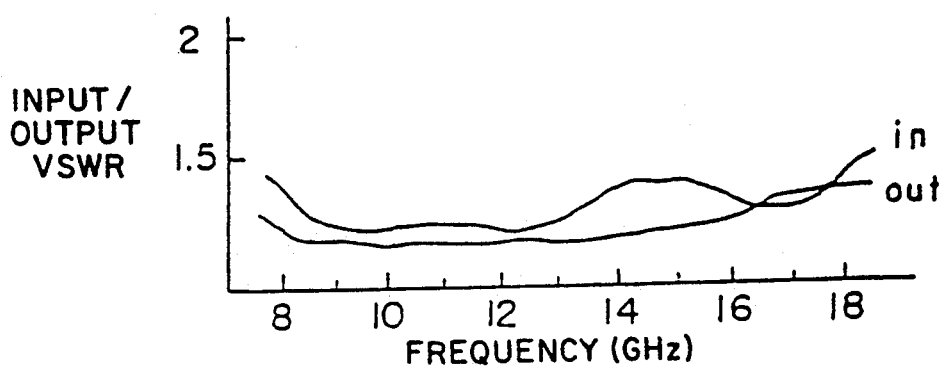

FIG. 27 is a graph of the relationship between input-/output VSWR and frequency of a device explained with respect to FIG. 25. Input/output VSWR is plotted on the vertical axis and frequency on the horizontal axis, respectively, and "in" indicates an input characteristic and "out" an output characteristic, respectively. Such excellent characteristics are attributed to the fact that connections of internal or external circuits are established by the strip lines and as conversion is required.

Figure 2:
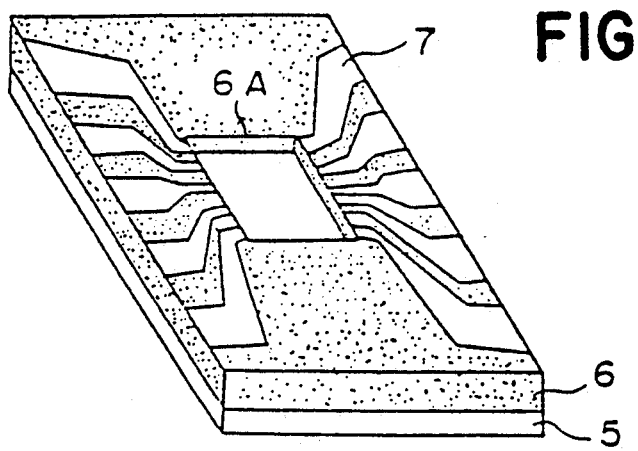
Figure 3:
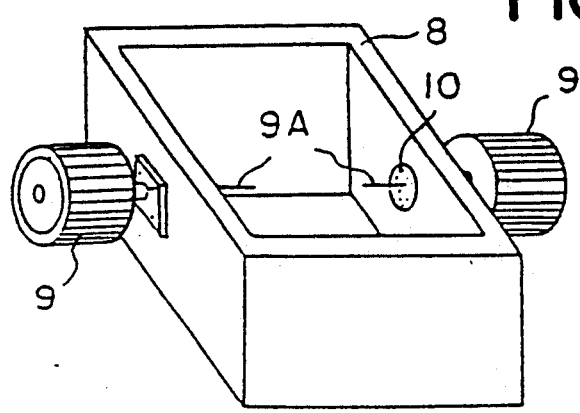
Figure 4:
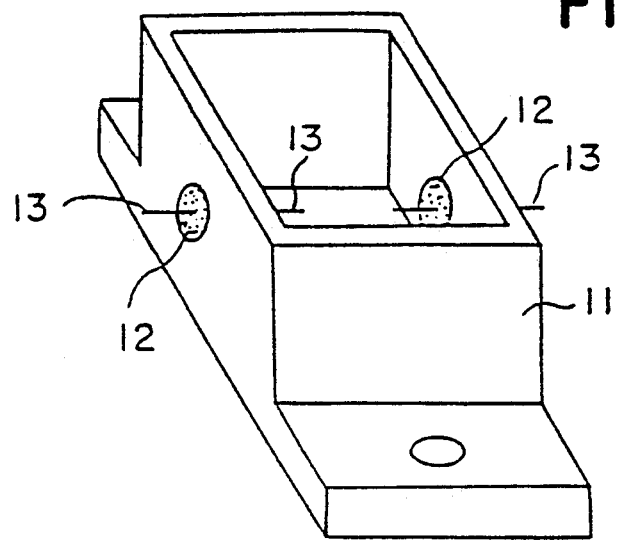
Figure 5:
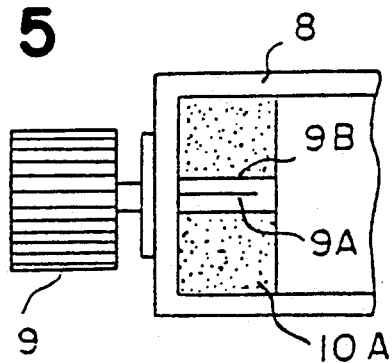
Figure 6:
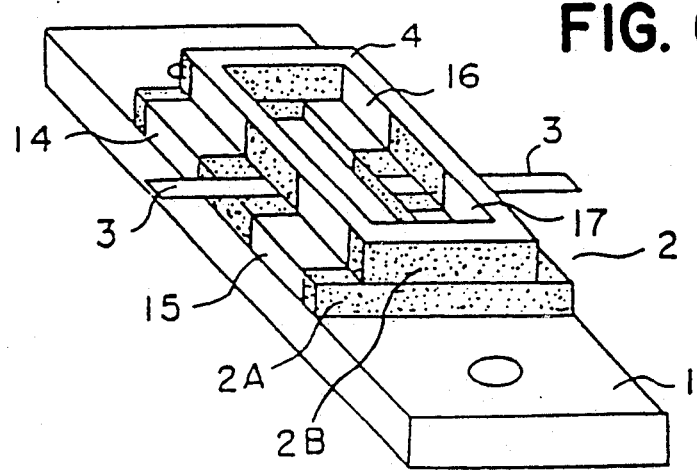
Figure 7:
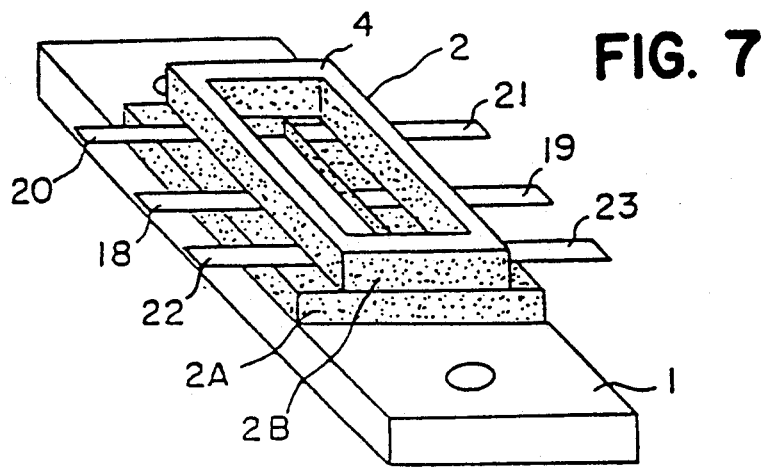
Figure 8:
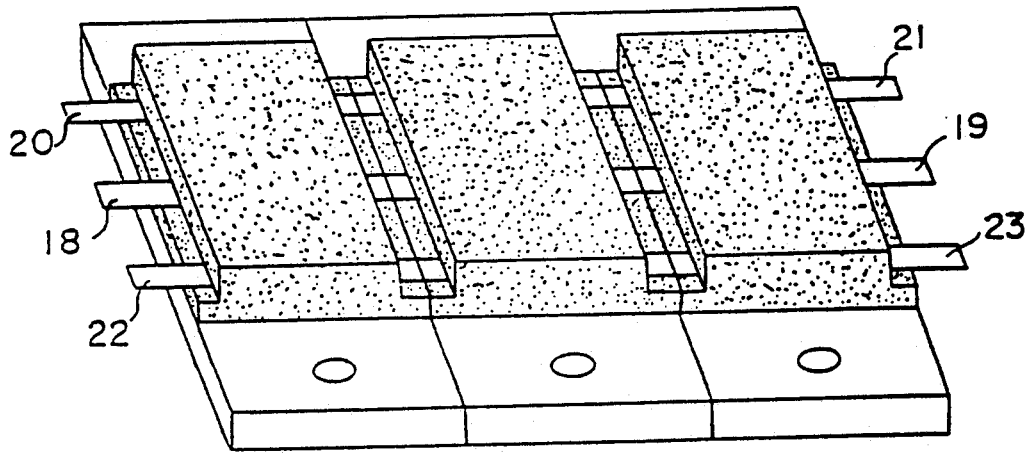
Figure 9:
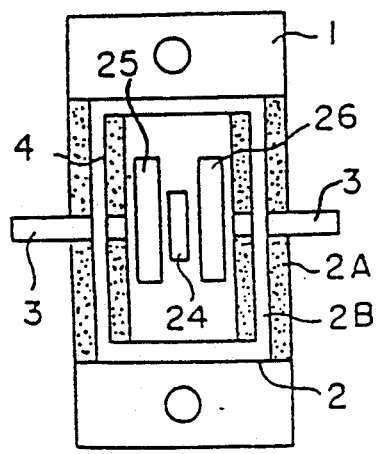
Figures 28A, 28B:
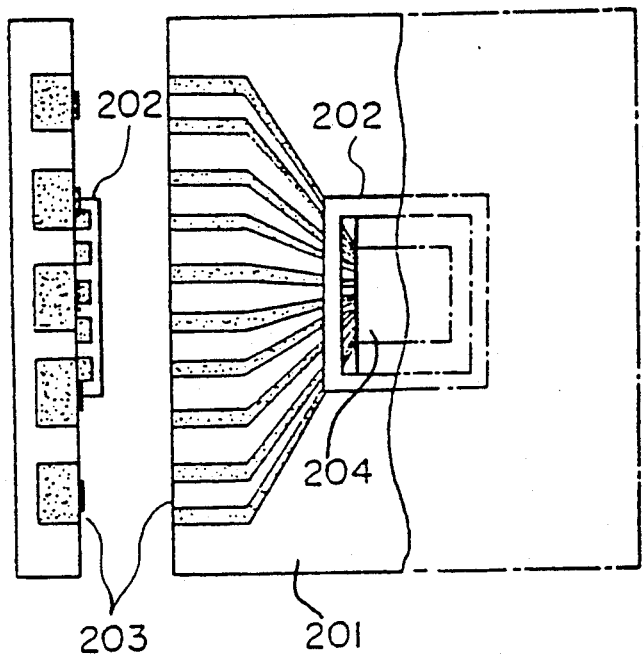
Figure 29:
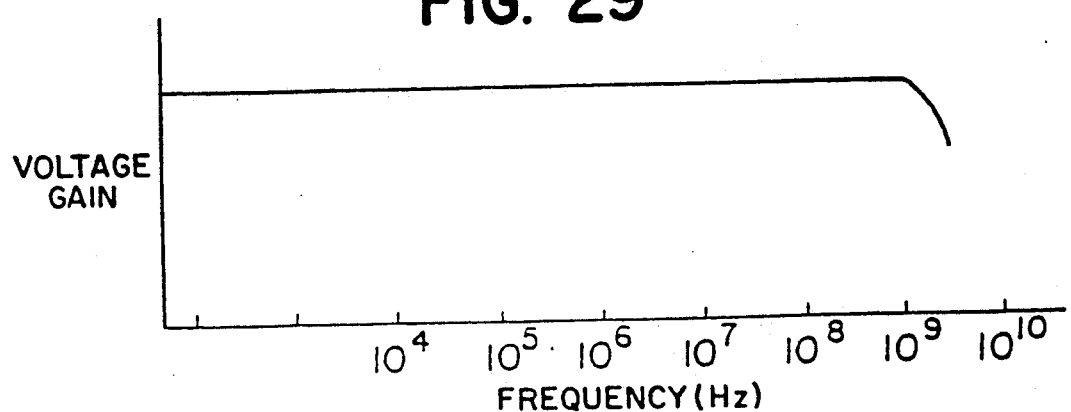
FIG. 29 is a graph of a characteristic of a differential amplifier of the embodiment shown in FIG. 28.

FIG. 28 is an embodiment of a semiconductor device for a high speed digital circuit where 28(a) is a plan view of the principal part and 28(b) is a front view of the same. This embodiment is basically the same as that of FIG. 25, except for its appearance. In this figure, 201 is a metal base; 202 is a case; 203 is an electric terminal; and 204 is a semiconductor chip, respectively. This embodiment is effective as a high speed A/D converter, high speed prescaler and high speed operation circuit and these circuits operate, for example, at a frequency up to several GHz in the case of a GaAs device. Currently, a current device explained With respect to FIG. 2 is used and one would expect the use of such a circuit to be followed by the disadvantages as explained previously. However, the sealing part between the metal base 201 and electric terminal 203 in this embodiment is designed as the pseudo-coaxial line as in the case of the present invention embodiments and the characteristic impedance of it including the strip line is 50Ω. That is, the disadvantages of existing devices are perfectly eliminated by the present invention. It is also possible not only for this embodiment but also for other embodiments to set the impedance of the entire strip line—sealing part (pseudo-coaxial line part)—strip line to 50Ω and to do this, the strip line or its laminate part may sometimes take the shape of a tapered line or some shape other than a straight line. Moreover, in the embodiment of FIG. 28, it is also possible to bond the lead segment to the strip line and extend it outside the metal base 201. The package of FIG. 28 also allows installation of a GaAs differential amplifier and FIG. 29 is a diagram indicating a relationship between power gain and frequency. In this case, an excellent characteristic is also obtained.

A semiconductor device according to the present invention provides a structure where strip lines are formed on an insulator base, and an electric terminal providing an insulator bridge in the area in the vicinity of a laminate part of such strip lines is engaged with a through-passage by inserting it into the hole or cutaway part of a metal base of a metal case. The electric terminal is directly secured in a wider area to the metal base which is kept at the earth or a grounded potential. Therefore, there is no fear of unreliable grounding which occurs when such a terminal is secured through the ring portion as in the case of the prior art. Moreover, the device does not generate cracks in the insulator of the electric terminal due to differences in thermal expansion coefficients. Resonance due to a ring structure does not occur even when a cover is secured to the upper edge of the metal case directly or through a metallized film.

What is claimed is:

1. A package for a semiconductor device, comprising:
   a solid metal case having a through passage connecting an inside and outside of said case; and
   an electric terminal in the through passage, said electric terminal comprising:
   an insulator base having a planar surface;
   a strip line conductor formed on said insulator base; and
   an insulator piece abutting part of the planar surface, an upper surface of said conductor being exposed on both sides of said piece and being provided on the inside and outside of said metal case.

2. A package as recited in claim 1, further comprising a lead segment secured to said conductor on the outside of said case.

3. A package as recited in claim 1, wherein said case has a step like exterior surface.

4. A package as recited in claim 1, further comprising a metal cap abutting said case.

5. A package as recited in claim 1, wherein said semiconductor device is a GaAs-FET connected to said conductor.

6. A package as recited in claim 1, wherein said insulator base extends beyond said case.

7. A package for a semiconductor, comprising:
   a solid metal case having first and second adjacent through holes connecting an inside and outside of said case; and
   first and second electric terminals respectively in said first and second through holes, each electric terminal comprising:
   an insulator base having a planar surface;
   a strip line conductor formed on said insulator base; and
   an insulator piece abutting part of the planar surface, an upper surface of said conductor being exposed on both sides of said piece and being provided on the inside and outside of said metal case.

8. A package as recited in claim 7, further comprising:
   a third through hole adjacent to said second through hole; and
   a third electric terminal respectively in said third hole.

9. A package as recited in claim 8, wherein said third electric terminal comprises:
   an insulator base having a planar surface;
   a strip line conductor formed on said insulator base; and
   an insulator piece abutting part of the planar surface, and upper surface of said conductor being exposed on both sides of said piece and being provided on the inside and outside of said metal case.

10. A package as recited in claim 7, wherein said through holes are located on the same side of said case.

11. A package for a semiconductor, comprising:
    a solid metal case having a through slot connecting an inside and outside of said case; and
    an electric terminal in the through slot, said electric terminal comprising:
    an insulator base having a planar surface;
    a strip line conductor formed on said insulator base; and
    an insulator piece abutting part of the planar surface, an upper surface of said conductor being exposed on both sides of said piece and being provided on the inside and outside of said metal case.

12. A package as recited in claim 11, further comprising a metal cap abutting said case.

13. A package for a semiconductor, comprising:
- a solid metal case abutting a base and having a through cutout connecting an inside and an outside of said case;
- a metal frame abutting said case; and
- an electric terminal in the cutout, said electric terminal comprising:
  - an insulator base having a planar surface;
  - a strip line conductor formed on said insulator base; and
  - an insulator piece abutting part of the planar surface, an upper surface of said conductor being exposed on both sides of said piece and being provided on the inside and outside of said metal case.

14. A package as recited in claim 13, further comprising a metal cap abutting said frame.

15. An electric terminal for a through passage of a solid metal package for a semiconductor device, said terminal comprising:
- an insulator base having a planar surface;
- a strip line conductor formed on said insulator base; and
- an insulator piece abutting part of the planar surface, an upper surface of said conductor being exposed on both sides of said piece and being provided on the inside and outside of said metal case.

16. A terminal as recited in claim 15, wherein said package has a metal cap and said cap exposes the exposed upper surface of said conductor on the outside.

* * * * *